(12) United States Patent
Jautard et al.

(10) Patent No.: US 8,714,998 B2
(45) Date of Patent: May 6, 2014

(54) DEVICE FOR THE EXTERNAL ELECTRICAL CONNECTION OF ELECTRICALLY ACTIVE CELLS OF AN ELECTRICALLY ACTIVE PANEL

(75) Inventors: Yves Jautard, Ria Sirach (FR); Christian Hengel, Hochstatt (FR); Jean-Pierre Reyal, Eragny (FR)

(73) Assignees: Arcelormittal-Stainless and Nickel Alloys, Saint Denis (FR); Multicontact France, Hesingue (FR); Jautard Yves, Ria Sirach (FR)

( * ) Notice: Subject to any disclaimer, the term of this patent is extended or adjusted under 35 U.S.C. 154(b) by 848 days.

(21) Appl. No.: 12/919,682

(22) PCT Filed: Feb. 25, 2009

(86) PCT No.: PCT/FR2009/050302
§ 371 (c)(1),
(2), (4) Date: Nov. 9, 2010

(87) PCT Pub. No.: WO2009/112762
PCT Pub. Date: Sep. 17, 2009

(65) Prior Publication Data
US 2011/0041896 A1 Feb. 24, 2011

(30) Foreign Application Priority Data
Feb. 27, 2008 (EP) .................................... 08300119

(51) Int. Cl.
*H01R 12/24* (2006.01)
(52) U.S. Cl.
USPC .......................................... 439/496; 136/251

(58) Field of Classification Search
USPC .................... 439/496, 495; 136/251; 174/520
See application file for complete search history.

(56) References Cited

U.S. PATENT DOCUMENTS

| 4,310,211 A | 1/1982 | Bunnell et al. | |
|---|---|---|---|
| 7,632,109 B2* | 12/2009 | Boensch et al. | 439/76.1 |
| 2010/0018572 A1* | 1/2010 | Grimberg et al. | 136/252 |
| 2010/0275977 A1* | 11/2010 | Kinard et al. | 136/251 |

FOREIGN PATENT DOCUMENTS

| EP | 1 120 837 A2 | 8/2001 |
|---|---|---|
| WO | WO 2007/118798 A2 | 10/2007 |

* cited by examiner

*Primary Examiner* — Hae Moon Hyeon
(74) *Attorney, Agent, or Firm* — Merchant & Gould P.C.

(57) ABSTRACT

Device for the external electrical connection of a photovoltaic panel (1), which comprises a male connector which is arranged on the edge of the photovoltaic panel (1) and which comprises a plurality of external connection strips (5, 5', 5") which are electrically connected to the electricity-generating cells, a bar for electrically interconnecting the external strips, comprising electrical junction runners with respect to the external connection strips and electrical circuits which are suitable for the interconnection of the electricity-generating cells, a first external connector which comprises an electrical junction plate with respect to a first external connection strip and a second external connector which comprises an electrical junction plate with respect to a second external connection strip and a sleeve for retaining the assembly of the male connector, the interconnection bar, the first and the second external connector.

23 Claims, 11 Drawing Sheets

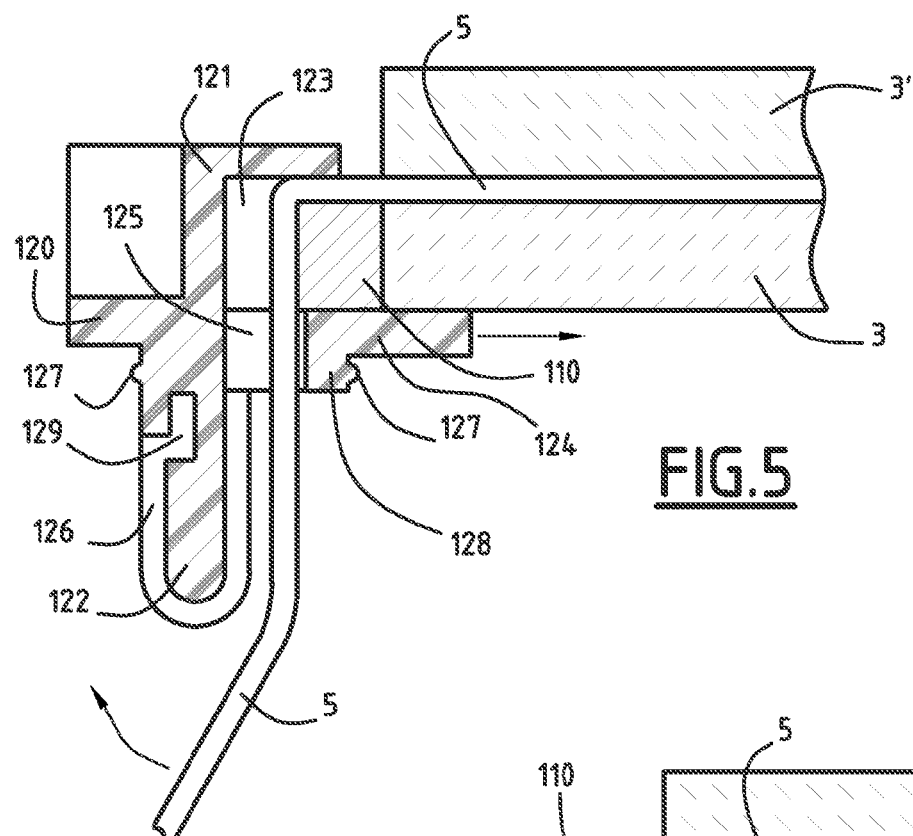
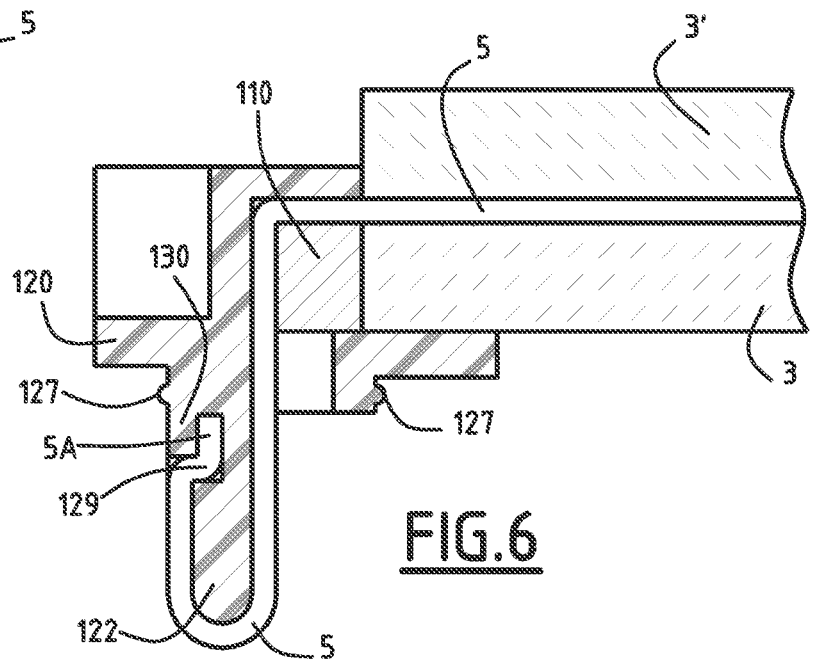

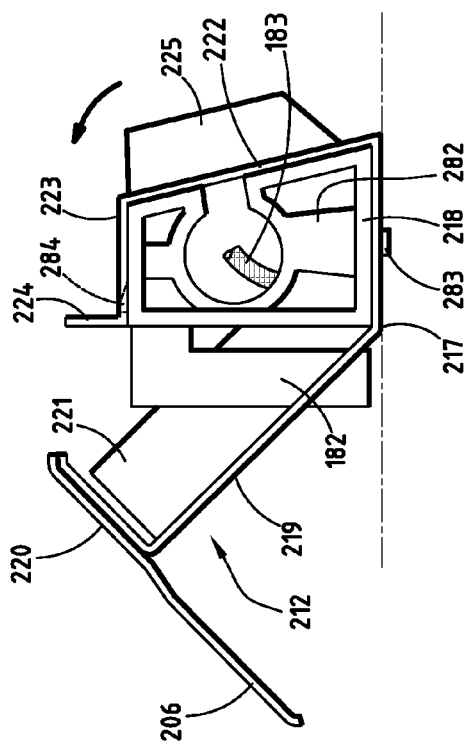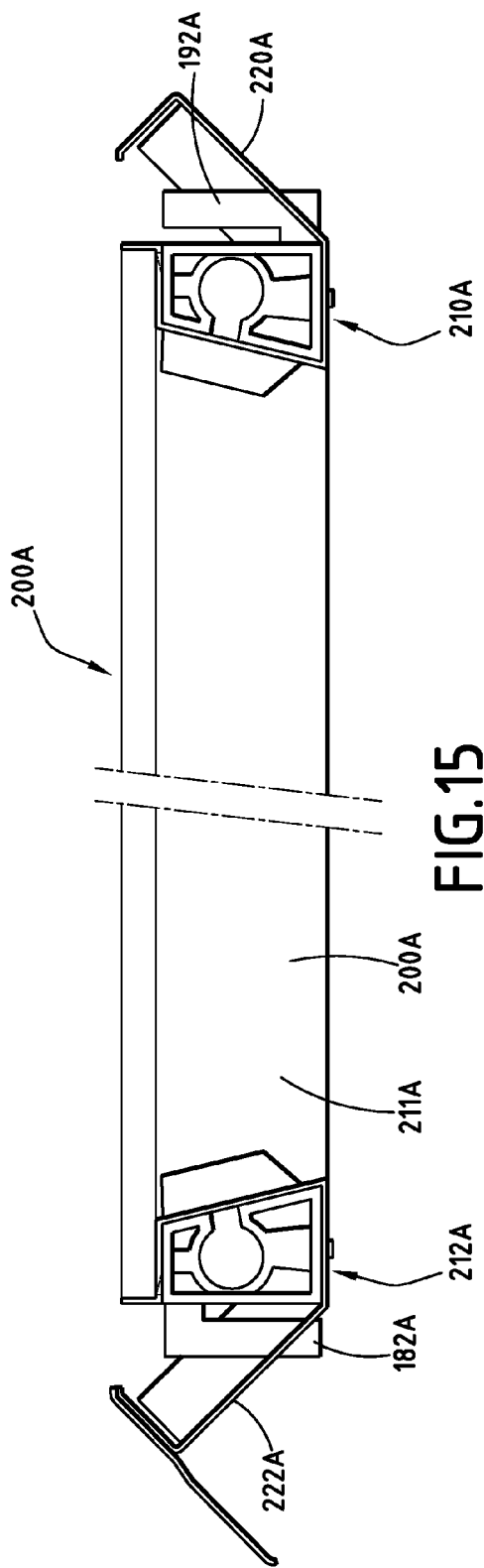

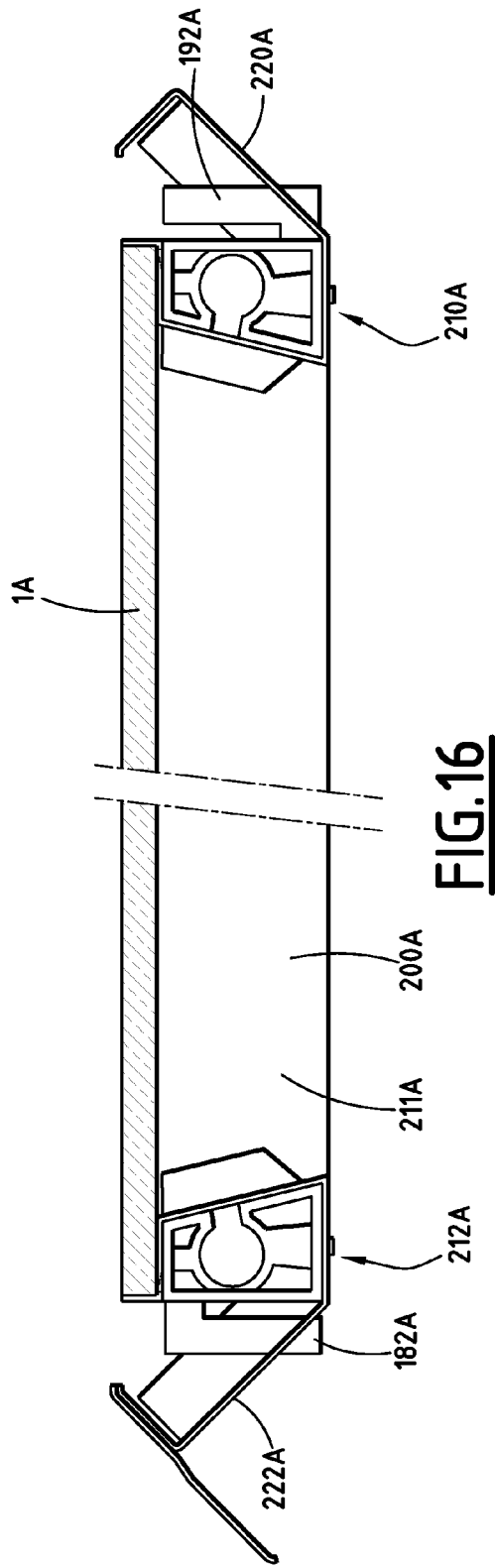
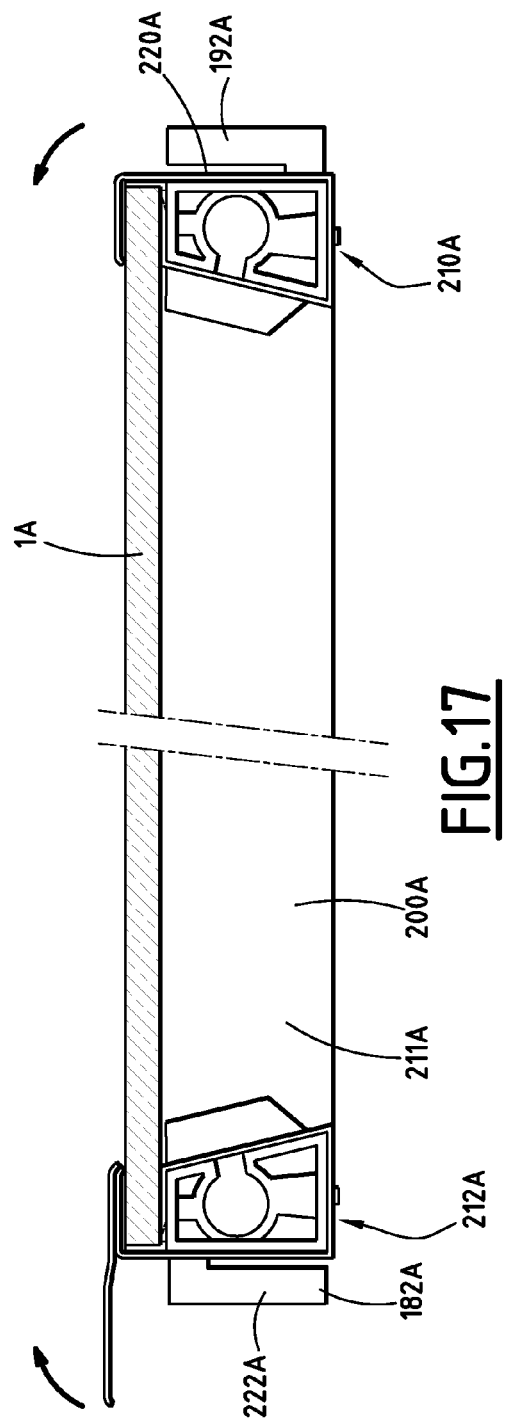

DEVICE FOR THE EXTERNAL ELECTRICAL CONNECTION OF ELECTRICALLY ACTIVE CELLS OF AN ELECTRICALLY ACTIVE PANEL

This application is a National Stage Application of PCT/FR2009/112762, filed Feb. 25, 2009, which claims benefit of Serial No. 08300119.8, filed Feb. 27, 2008 in the EPO and which applications are incorporated herein by reference. To the extent appropriate, a claim of priority is made to each of the above disclosed applications.

BACKGROUND OF THE INVENTION

The present invention relates to a device for the external electrical connection of electricity-generating cells of a photovoltaic panel.

In order to provide buildings such as houses with electricity generators using solar energy, assemblies of panels constituted by a plurality of photovoltaic cells are provided, for example, on the roof of those buildings. Those panels are generally constituted by a stack of different layers of glass, silicon, conductors and polymers. The silicon cells, which are generally square, have a dimension which may be up to 200 mm for each side. Those cells, which constitute electricity generators, are assembled in series then adhesively bonded between two glass sheets or between a sheet of glass and different polymer layers. By way of example, a module having nominal tension of 12 V is generally composed by 36 (2×18) monocrystalline or polycrystalline cells being placed in series. Those assemblies of 36 cells are subsequently assembled in parallel. In the case of a 24 V module, 72 silicon cells are therefore used.

Such panels or modules have a front face which is constituted by glass and directed towards the sun and which is intended to allow radiation to pass in such a manner that it can cooperate with the silicon cells and generate electricity. They also have a rear face which may be either opaque and constituted by a complex stack of polymers, or transparent and, for example, constituted by a pane of glass. Those modules or photovoltaic panels are arranged on frames which allow them to be fixed to the roofs. They are further connected to each other and to an external distribution circuit which is intended to supply power for the uses of electricity.

Generally, the connections are brought about at the rear of the photovoltaic panels by means of cable bundles which extend under the panels.

When the photovoltaic panels are transparent, those cable bundles are particularly unsightly which is a disadvantage particularly when the panels are intended to be positioned as the façade of a building. Such transparent panels can be used as ornamental means and the presence of bundles of cable at the rear which are visible owing to the transparent nature of the assembly makes those panels unsuitable for this type of use.

SUMMARY OF THE INVENTION

An object of the present invention is to overcome those disadvantages by providing a universal means which allows electricity-generating cells of a photovoltaic panel to be connected to an external circuit and which complies with at least one of the objectives below:

Not blocking one of the faces of the panel when it is transparent.

Allowing connections at the edge of the photovoltaic panel whatever the type of panel, whether transparent or opaque.

Allowing interventions in the electrical connection of the panels whilst ensuring the safety of the operators by IP2X, whatever the type of photovoltaic panel, that is to say, including panels currently produced (Standard IEC 529, NF EN 60529).

To that end, the invention relates to a device for the external electrical connection of the electrically active cells of an electrically active panel, such as the electricity-generating cells of a photovoltaic panel, which comprises:

a male connector which is arranged on the edge of the photovoltaic panel and which comprises a plurality of external connection strips which are electrically connected to the electricity-generating cells, a bar for electrically interconnecting the external strips, comprising electrical junction means with respect to the external connection strips which are connected to each other by electrical circuits which are suitable for the interconnection of the electricity-generating cells, a first external connector which comprises an electrical junction means with respect to an external connection strip which is connected to a first polarity of the electricity-generating cells, a second external connector which comprises an electrical junction means with respect to an external connection strip which is connected to a second polarity of electricity-generating cells and a means for retaining the assembly of the male connector, the interconnection bar, the first and the second external connector.

Preferably, the male connector comprises a bar for supporting the external connection strips comprising a plate which extends at the outer side of the photovoltaic panel, and the external connection strips are wound around the plate.

Preferably, the male connector further comprises a spacer which comprises recesses which are intended to receive the external connection strips, and the support bar comprises a head which is suitable for being fitted to the spacer.

The spacer is preferably adhesively bonded to the edge of the photovoltaic panel.

Preferably, the plate extends at the outer side of the photovoltaic panel, perpendicularly relative to the surface of the photovoltaic panel.

The means for retaining the assembly is, for example, a hollow sleeve which comprises an upper opening, in which the bar for supporting the external connection strips is fitted. The periphery of the upper opening and the portion of the bar that is intended to be fitted in the upper opening are formed so as to ensure the tightness of the junction of the sleeve and the bar.

The bar comprises, for example, a peripheral bead which is intended to ensure the tightness of the junction with respect to the sleeve.

The sleeve and the bar can be adhesively bonded to each other.

Preferably, the sleeve comprises, at each of the ends thereof, a passage for an external connector.

The passage for an external connector is, for example, an indentation whose periphery comprises a groove.

Preferably, each external connector comprises an electrical junction paddle with respect to an external connection strip, which is electrically connected to an external connection lug, and a sleeve which is composed of flexible polymer material and which is suitable for being fitted in the passage for an external connector of the sleeve so as to constitute tight closure of the passage.

Preferably, the external connection lug of an external connector is a male lug and the external connection lug of the other external connector is a female lug.

The junction paddle of at least one external connector may be welded by brazing to an external connection strip.

Preferably, the electrical interconnection bar comprises a plate which comprises electrical junction runners with respect to the external strips and which can be reversibly fitted in a lower opening of the hollow sleeve.

Preferably, the periphery of the lower opening of the sleeve and the portion of the interconnection bar which is intended to be fitted in the sleeve are formed so as to ensure the tightness of the junction of the sleeve and the interconnection bar.

Preferably, the male connector, the interconnection bar and the assembly retention means comprise at least one piece of plastics material.

The electrical circuits which are suitable for interconnecting the cells may comprise bypass diodes and parallel or series connections of electricity-generating cells.

Preferably, the external connection strips are conductive strips which are partially insulated by insulation layers such as enamel layers.

Finally, the invention relates to an electrically active panel which comprises at least one electrically active cell which is provided with an external connector according to the invention.

The invention also relates to an electrically active panel such as a photovoltaic panel which is mounted in a support frame which comprises four tubular hollow uprights and external connection means for the electrically active panel, whose external connection means are in accordance with the invention and are provided inside the hollow tubular portions of the uprights of the support frame.

Preferably, the external connection means comprises at least one male external connection lug and one female external connection lug which extend outside the frame and which are provided in such a manner that the electrically active panels of two adjacent frames can be connected to each other by a male lug of a frame and a female lug of the other frame being fitted together.

Preferably, the frame is constituted by at least one metal strip which is cut and shaped by bending.

Preferably, the frame is constituted by four separate uprights which are assembled together.

BRIEF DESCRIPTION OF THE DRAWINGS

The invention will now be described in greater detail but in a non-limiting manner with reference to the appended Figures, in which:

FIG. 5 is a sectional view in an intermediate assembly position of a male connector of the electricity-generating cells of a photovoltaic panel, FIG. 6 is a sectional view of the male connector of FIG. 5, in the position for use, FIG. 14 is a sectional view of the upright of FIG. 12 in a second assembly phase, FIGS. 15, 16 and 17 are sectional side views of a support frame of a photovoltaic panel in three successive assembly phases.

DETAILED DESCRIPTION OF THE INVENTION

Figure 1:
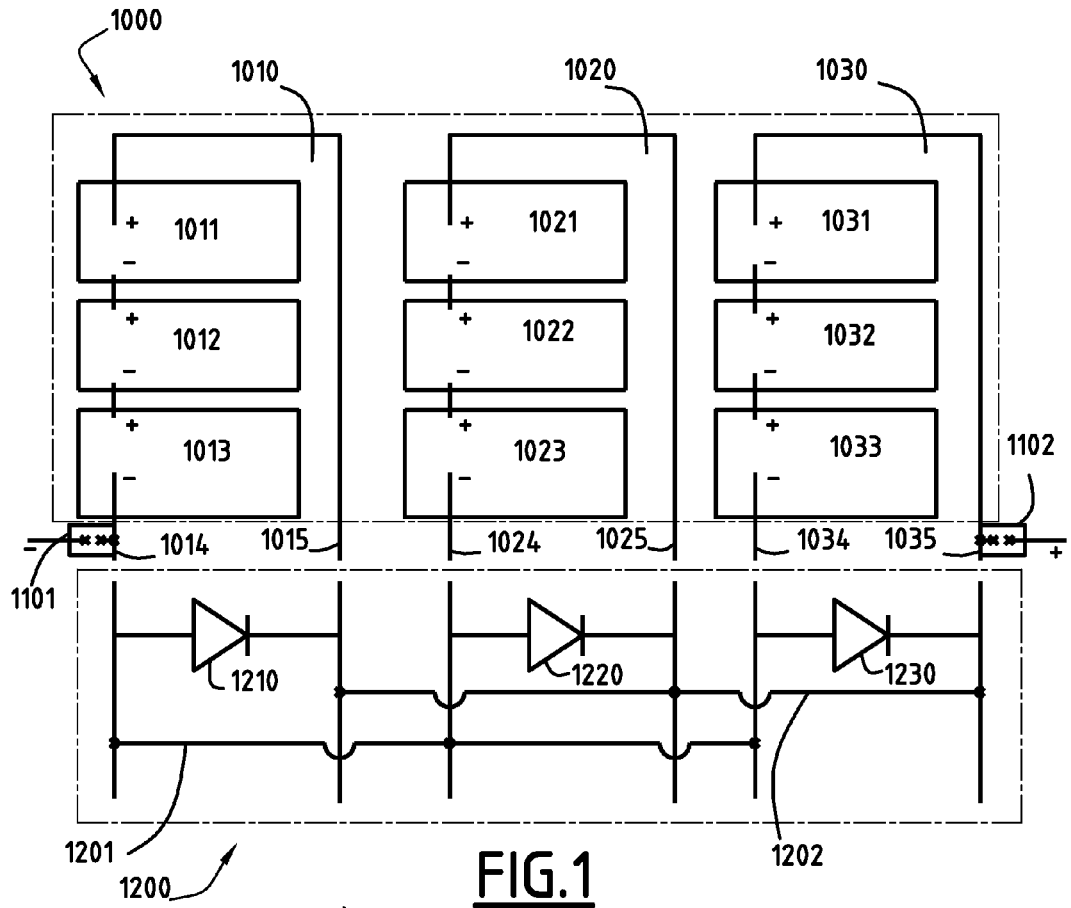
FIG. 1 is a schematic illustration of the circuits for connecting an assembly of electricity-generating cells of a photovoltaic panel.
Figure 2:
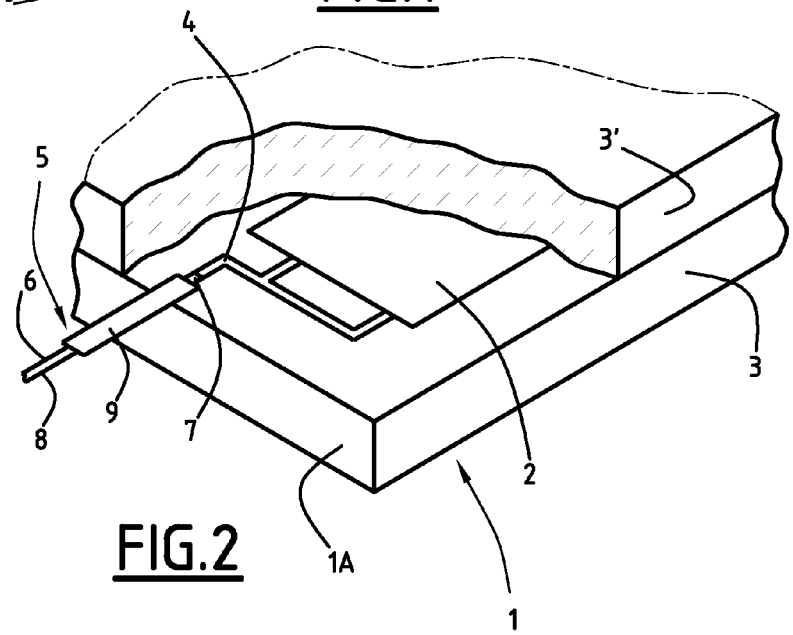
FIG. 2 is a view with partially cutaway portions of the connection to the outer side of a polarity of an electricity-generating cell of a photovoltaic panel.

First, there will be described the general principle of a connection to an external operating circuit of the electricity generators of a photovoltaic panel. To that end, reference will be made to FIG. 1.

The photovoltaic panel which is generally designated 1000 comprises a plurality of strings 1010, 1020, 1030 of electricity-generating cells which are designated 1011, 1012, 1013 for the string 1010, designated 1021, 1022, 1023 for the string 1020 and designated 1031, 1032, 1033 for the string 1030, respectively. Each of the electricity-generating cells comprises a positive pole and a negative pole. In each of the strings 1010, 1020, 1030, the electricity-generating cells are assembled in series so that each string comprises a connection to a negative pole and a connection to the positive pole. In the example illustrated, the string 1010 has a connection to the negative pole 1014 and a connection to the positive pole 1015 and, in the same manner, the string 1020 has a connection to the negative pole 1024 and a connection to the positive pole 1025 and the string 1030 has a connection to the negative pole 1024 and a connection to the positive pole 1025 and the string 1030 has a connection to the negative pole 1034 and a connection to the positive pole 1035. The group of strings is connected in parallel by means of a connection circuit 1200 which comprises on the one hand connections 1201 for connecting the negative poles 1014, 1024 and 1034 to a negative pole of the operating circuit 1101, and a circuit 1202 for connecting the positive poles 1015, 1025 and 1035 of the strings of electricity-generating cells to a common positive external connector 1102. Furthermore, the interconnection circuit of the strings of electricity-generating cells comprises bypass diodes 1210, 1220 and 1230 which are arranged between the negative pole and the positive pole of each of the strings of electricity-generating cells: between the negative connection 1014 and the positive connection 1015 of the string of electricity-generating cells 1010, in the same manner between the negative pole 1024 and the positive pole 1025 of the string 1020, and between the negative pole 1034 and the positive pole 1035 of the string 1030. Each of those diodes allows the corresponding string of electricity-generating cells to be bypassed when that string is damaged or, when that string is in the shade of a cloud, it becomes receptive in relation to the other strings of cells.

In the example described above, the photovoltaic panel comprises three strings of electricity-generating cells, each string comprising three electricity-generating cells. However, the person skilled in the art will understand that a photovoltaic panel may comprise a different number and in particular a larger number of strings of electricity-generating cells each comprising a different number, in particular more than three electricity-generating cells. The person skilled in the art will also understand that branches other than those which have been described are possible. In particular, a plurality of strings can be connected to each other in series instead of being in parallel.

There will now be described an embodiment of a device for the external electrical connection of a photovoltaic panel.

The photovoltaic panel which is generally designated 1 comprises at least one electricity-generating cell 2 which is secured and adhesively bonded between a lower plate 3 and an upper plate 3'. Each pole of the electricity-generating cell 2 is connected by conduction strips 4 (only one being visible in the Figure) which, for the ones which are intended to be connected towards the outer side of the panel, are connected to an external connection strip which is generally designated 5. The external connection strip is constituted by a strip 6 of conductive material, such as copper, of which a portion of the surface is insulated, for example, by a layer of enamel 9, and an end 7 of which is welded to the conductive strips 4 so as to ensure an electrical junction and the end 8 of which located towards the outer side of the panel is exposed so as to be able to ensure electrical contact with a connection means. The external connection strip which is arranged at the interface between the lower layer and the upper layer of the photovoltaic panel extends towards the outer side of the edge 1A thereof.

Although only one external connection strip is visible in the Figure, the person skilled in the art will understand that a panel which comprises a plurality of strings of electricity-generating cells may comprise an external connection strip for the positive pole of each string of electricity-generating cells and an external connection strip for the negative pole of each string of electricity-generating cells. In that manner, a photovoltaic panel which comprises three strings of electricity-generating cells may comprise at least four external connection strips which extend towards the outer side of the edge of the photovoltaic panel in accordance with the type of connection selected by the manufacturer of photovoltaic panels and may, for example, comprise six of them, as illustrated in the drawing.

The arrangement in series or parallel of strings of cells may be carried out inside the photovoltaic panel; the bypass diodes are often inserted in the panel. As is the case in the example described, however, each string can be connected to the others outside the panel. Therefore, there are six connection strips.

In order to ensure the interconnections between the various strings of electricity-generating cells and the connection towards the outer side of the photovoltaic panel, the external connection strips which have been described are incorporated in an assembly which constitutes the external connection device of the electricity-generating cells of a photovoltaic panel which will now be described and which is illustrated in an exploded state in FIG. 3.

Figure 3:
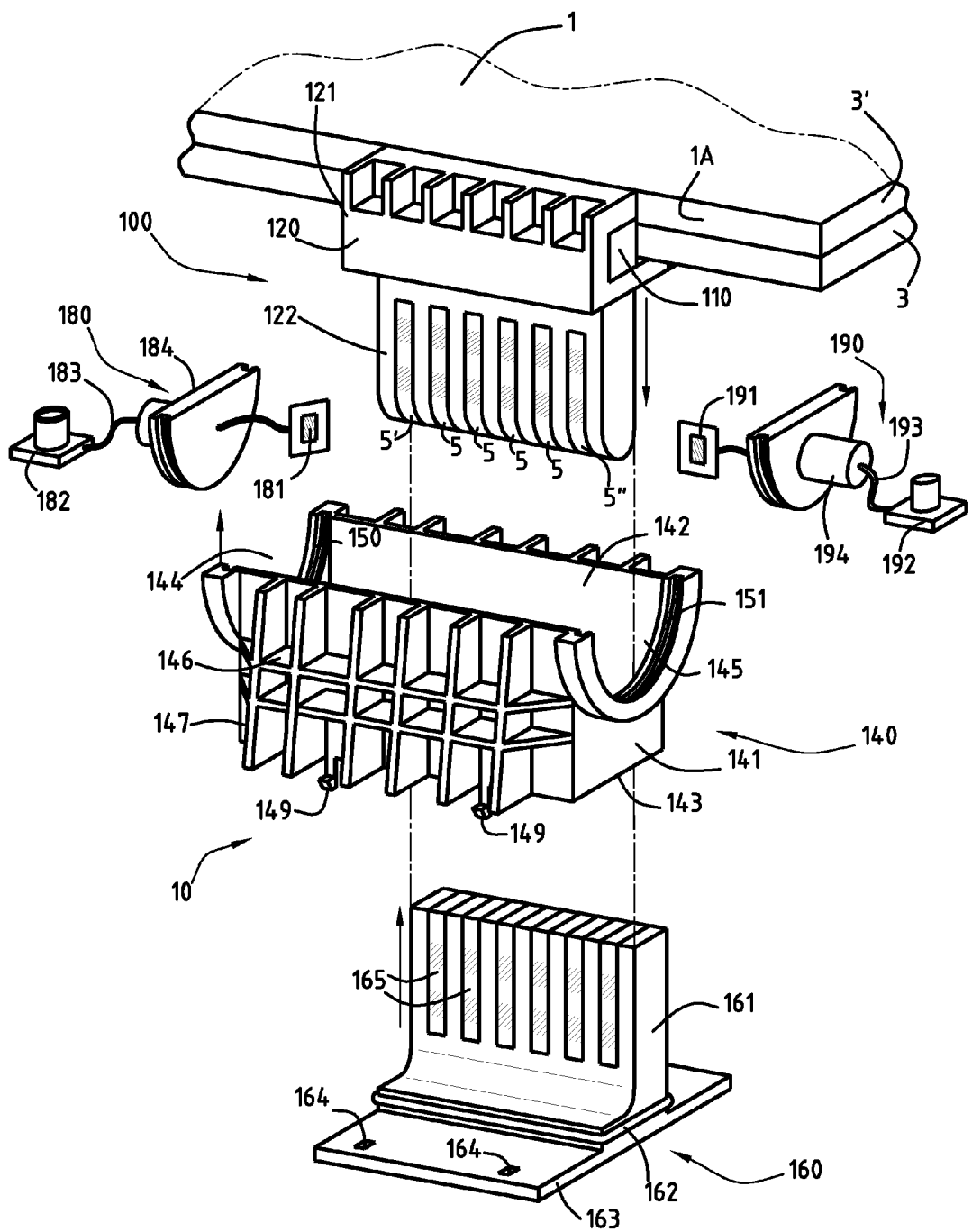
FIG. 3 is an exploded view of an external electrical connection device for the electricity-generating cells of a photovoltaic panel.

The device for external electrical connection illustrated in FIG. 3 comprises a male connector which is generally designated 100 and which is fixed to the edge 1A of the photovoltaic panel 1, an electrical interconnection bar for the external strips which is generally designated 160, a first external contactor which comprises an electrical junction means with respect to the external connection strips which is connected to a first polarity of electricity-generating cells generally designated 180, a second external connector which comprises an electrical junction means with respect to an external connection strip which is connected to a second polarity of electricity-generating cells which are generally designated 190, and finally a means for retaining and assembling the male connector, the interconnection bar, the first and the second external connector. That means for retaining and assembling is a hollow retention sleeve generally designated 140.

Figure 4:
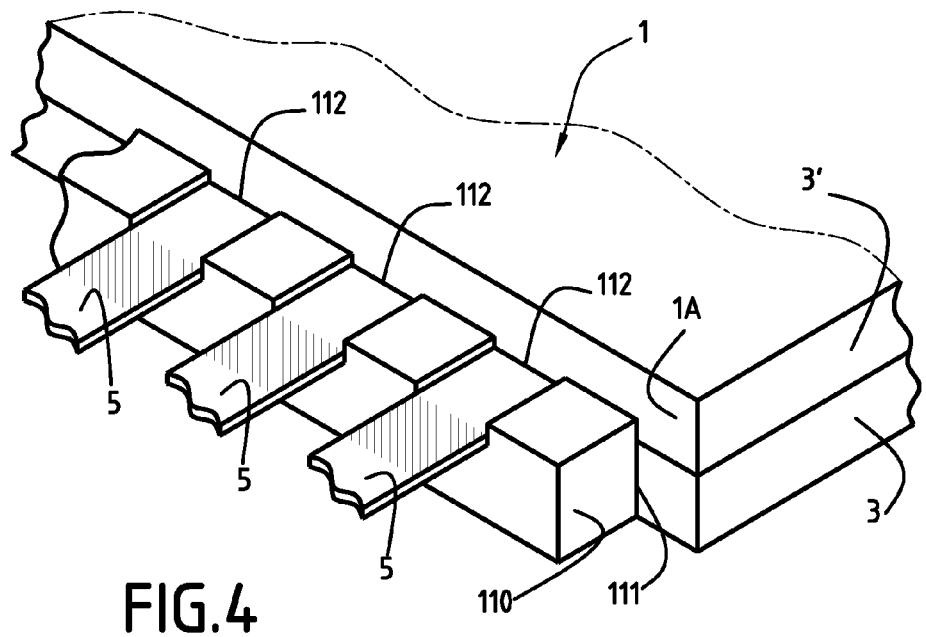
FIG. 4 is a partial perspective view of external connection strips of electricity-generating cells of a photovoltaic panel opening at the edge of the photovoltaic panel.

There will now be described the male connector which is generally designated 100. That male connector first comprises a spacer 110 which is adhesively bonded against the edge 1A of the photovoltaic panel. As is illustrated in FIG. 4, that spacer 110 comprises recesses 112 which serve to receive the external connection strips 5 which extend out of the edge 1A of the photovoltaic panel. That spacer 110 serves to maintain a bar 120 for supporting the strips (see FIGS. 3, 4; 5, 6) which comprises a fixing head 121 and a plate 122 which extends towards the outer side of the panel perpendicularly relative thereto. The plate 122 comprises grooves 126 which are intended to receive external connection strips 5. The head 121 of the bar 120 comprises a groove 123 which is intended to become fitted to the spacer 110 which is adhesively bonded to the edge of the photovoltaic panel. The head also comprises a lower thin plate 124 which is intended to move into contact with the lower portion of the photovoltaic panel. That lower thin plate 124 comprises an opening 125 which is intended to allow the passage of the external connection strips 5. That opening 125 has sufficiently large dimensions for, during assembly, the external connection strips 5 to be able to pass through that opening and, after the strips have been put in place, the bar to be able to be placed definitively in position and moved towards the edge of the photovoltaic panel, as is illustrated in FIGS. 5 and 6.

Particularly in FIG. 6, it is apparent that the external connection strips 5 are arranged inside the grooves 126 of the plate 122 and are wound around the plate 122 which is intended to support the strips, the end of each strip being taken up in a recess 129 located at the junction between the plate 122 and the fixing head 121 of the bar 120. The recess 129 comprises edges 130 which can be bent over in order to fix in position the external connection strips 5, 5', 5". Those edges can be bent over, for example, by ultrasound. Finally, at the upper portion of the plate, the connector comprises a base 128 which is intended to be fitted in the hollow retention sleeve 140. That base 128 comprises a bead 127 which extends at the periphery thereof and which is intended to ensure the tightness during assembly of the male connector in its support. There is thereby obtained a male connector which comprises a connection plate which extends towards the outer side of the photovoltaic panel and around which the conductive strips are wound and can thereby move into contact with connection runners.

As illustrated in FIG. 3, the male connector is intended to be inserted in the hollow retention sleeve generally designated 140, which has an upper opening 142 which is intended to receive the male connector and a lower opening 143, in which there will be inserted the electrical interconnection bar 160 which will be described below. The hollow retention sleeve 140 comprises a body 141 which is generally rectangular and of which the two ends comprise generally semicircular indentations 144 and 145 which are intended to receive the external connectors 180 and 190. The side walls 146 of the hollow retention sleeve 140 are reinforced by ribs 147 and, at the lower portion thereof, comprise small hooks 149 which are intended to retain the interconnection bar 160. The semi-circular indentations 144 and 145 which are intended to receive the external connectors comprise grooves 150 and 151, in which joints associated with the external connectors can be inserted.

As has been indicated, the device for external electrical connection comprises two external connectors which are generally designated 180 and 190. The first external connector 180 comprises an electrical junction paddle 181 which is a plate of cuprous material which can be covered by brazing paste. That electrical junction paddle is connected by an electrical conductor 183 to an external connection lug 182 which is, for example, a female connection lug. The conductive wire 183 extends through a sleeve which is composed of flexible polymer material 184 and whose shape is suitable for being able to be fitted in the indentation 144 of the hollow retention sleeve 140. The edge of the sleeve of polymer material 184 is suitable for being able to be inserted into the groove 150 which extends at the periphery of the indentation 144 of the hollow retention sleeve 140 so as to ensure the tightness. In the same manner, the second external connector 190 comprises an electrical junction paddle 191 which is also of a cuprous alloy and on which there is deposited a brazing paste. The electrical junction paddle is connected to an external connection lug 192 which is a male lug by means of an electrical conductor 193 which extends through the sleeve 194 of flexible polymer material which is suitable for being able to be fitted in the indentation 145 of the hollow retention sleeve 140. The edge of the sleeve 194 is suitable for being inserted in the groove 151 which extends at the periphery of the indentation 145 so as to ensure good tightness. It will be noted that, when the male connector 100 is fitted in the hollow retention sleeve 140 and the external connectors 180 and 190 are arranged in the hollow retention sleeve 140, the junction paddles 181 and 191 move into contact with the external connection strips 5' and 5" which are located at the ends of the plate 122 of the male connector 100. When the junction paddles 181 and 191 are in contact with the connection strips, they can be welded, for example, by induction heating from the outer side, that induction heating causing the brazing paste to melt and thereby ensuring the brazing of the junction paddles to the connection strips.

It is also possible to bring about the connection using junction paddles which are constituted by lamellar contacts which allow the connections to be brought about without brazing.

When the male connector and the external connectors are arranged in the hollow retention sleeve 140, the tightness of the connector of the assembly is ensured, on the one hand, by the sleeves of flexible polymer material 184 and 194 of the external connectors and, on the other hand, by the beads 127 which are in the upper portion of the plate of the male connector and which move into contact with the periphery of the upper opening 142 of the hollow retention sleeve 140. The shape of the upper opening 142 of the hollow retention sleeve 140 is suitable for there to be good adjustment of the male connector in the hollow retention sleeve 140 so as to ensure excellent tightness. In order to promote tightness, the male connector can further be adhesively bonded to the upper portion of the hollow retention sleeve 140.

As has been indicated above, the electrical connection device also comprises an electrical interconnection bar which is for the external strips and is generally designated 160 and which comprises a central plate 161 which comprises junction runners 165 which are provided so as to move into contact with the external connection strips 5, 5', 5" of the plate of the male connector. That plate 161 of the electrical interconnection bar comprises, at its lower portion, sealing beads 162 and a base 163 which comprises openings 164. The electrical interconnection bar is fitted in the lower opening 143 located in the lower portion of the hollow retention sleeve 140, the plate 161 moving opposite the plate 122 of the male connector so that the electrical junction runners 165 move into contact with the external connection strips 5, 5' and 5".

Furthermore, the hooks 149 which are arranged in the lower portion of the hollow retention sleeve 140 are snap-fitted in the openings 164 provided in the base 163 of the interconnection bar. Finally, the beads 162 located at the base of the interconnection bar move into contact with the side walls of the hollow retention sleeve 140 and thereby bring about tightness.

Figure 7:
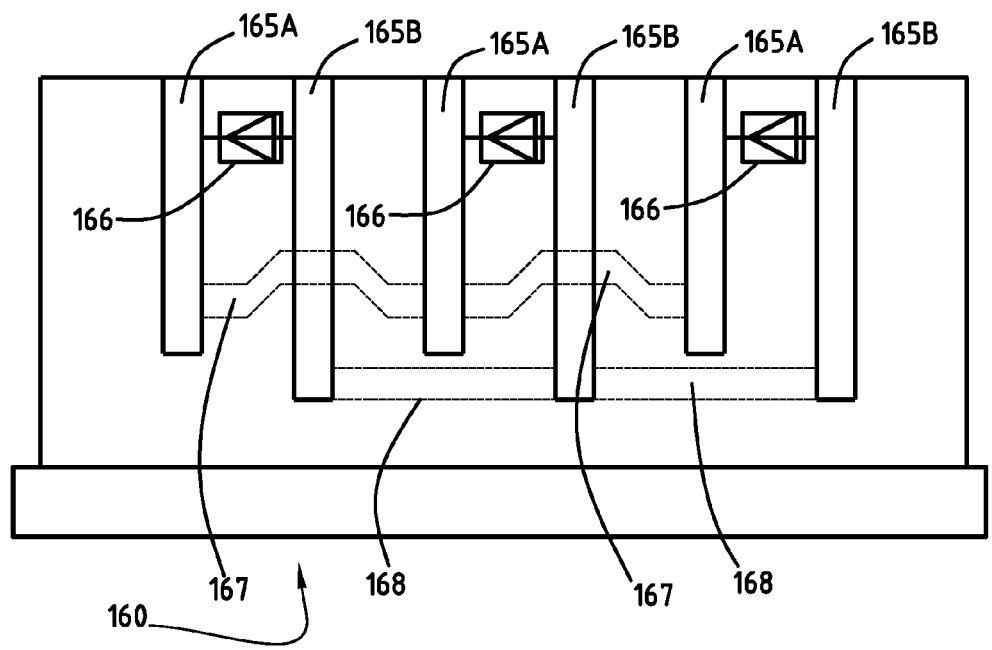
FIG. 7 is a schematic view of an electrical interconnection bar of the external bars for connecting the electricity cells of a photovoltaic panel.

Furthermore, the interconnection bar comprises electrical circuits for interconnecting the different strings of electricity-generating cells of the photovoltaic panel corresponding, for example, to the electrical circuit diagram shown in FIG. 1. Those electrical circuits which are overmoulded inside the plate 161 may comprise, as is illustrated in FIG. 7, diodes 166 which bring about a bypass between the runners 165A and 165B which are connected on the one hand to the negative and positive poles, respectively, of the strings of electricity-generating cells and, on the other hand, may also contain interconnections 167 between the runners 165A which come into contact with the negative poles of the strings of electricity-generating cells, and interconnections 168 between runners 165B which are intended to move into contact with the connectors of the positive poles of the strings of electricity-generating cells.

That interconnection bar is mounted in a removable manner in the retention sleeve so as to be able to be changed to replace those bars when components such as the diodes have been damaged.

That connection bar allows the diodes of the photovoltaic module to be changed without it being possible to inadvertently touch the electrically active portions of the photovoltaic module.

That interconnection bar also allows the different types of connection for the strings of electricity-generating cells to be brought about outside the photovoltaic module in accordance with the decision of the manufacturer of photovoltaic modules.

The assembly of the pieces which constitute that device for connecting a photovoltaic panel is, with the exception of the conductive elements, constituted by pieces of moulded plastics material. That plastics material may optionally be selected so as to have good thermal conductivity.

The external connection device which has been described is fixed to the edge of the photovoltaic panels and can be adapted to be able to be incorporated, for example, in the upright of the frames for supporting the photovoltaic panels. It can also be fixed to the upright of the aluminium corners currently used.

The external connection device which has been described is fixed to the edge of the photovoltaic panels. However, it may be adapted to be used as a replacement for the current connection devices of the photovoltaic modules, for which the connection strips open at the rear face of the photovoltaic panels. The person skilled in the art knows how to carry out such adaptation.

In the embodiment which has been described, the interconnection device allows connection in an outward direction of a photovoltaic panel comprising three strings of electricity-generating cells. However, the person skilled in the art will appreciate that it is possible to adapt this interconnection device to photovoltaic panels which comprise a greater or smaller number of strings of photoelectric cells.

In the example which has been described, the connector is mounted on a photovoltaic panel whose active cells are electricity-generating cells. However, such connectors can be mounted on any type of electrically active panel which comprises electrically active cells.

In that case, the electrically active device may be a generator, such as photovoltaic cells, or an electrical receiver, such as an LCD screen, electroluminescent organic panels, display panels such as plasma panels.

Such electrically active panels 1 are mounted in rectangular frames 200 which comprise four hollow uprights 210, 211, 212, 213. Each upright whose cross-section has, for example, the shape visible in FIG. 8, comprises a hollow tubular portion 201 which has a trapezoidal cross-section and which is overmoulded by a groove 202 which is intended to receive the edge of the electrically active panel 1.

Such uprights can be produced by various methods known to the person skilled in the art, but preferably by bending a metal strip having a thickness suitable for obtaining adequate rigidity and mechanical strength. Those strips are preferably composed of stainless steel but any suitable material known to the person skilled in the art may be used. In general, the uprights are constructed separately and assembled, for example, by welding, so as to constitute a frame. Particularly when the uprights are produced by metal strips being bent, however, two, three or four uprights may be constructed by bending a single strip cut out beforehand in a suitable manner.

The connectors according to the invention are provided in the uprights so as to be fixed in position and protected whilst allowing electrical connections both inside the hollow portions of the frame and in an outward direction in order to connect the active cells 2 of the panel and to connect the panels to each other or to an operating circuit 7.

Figure 8:
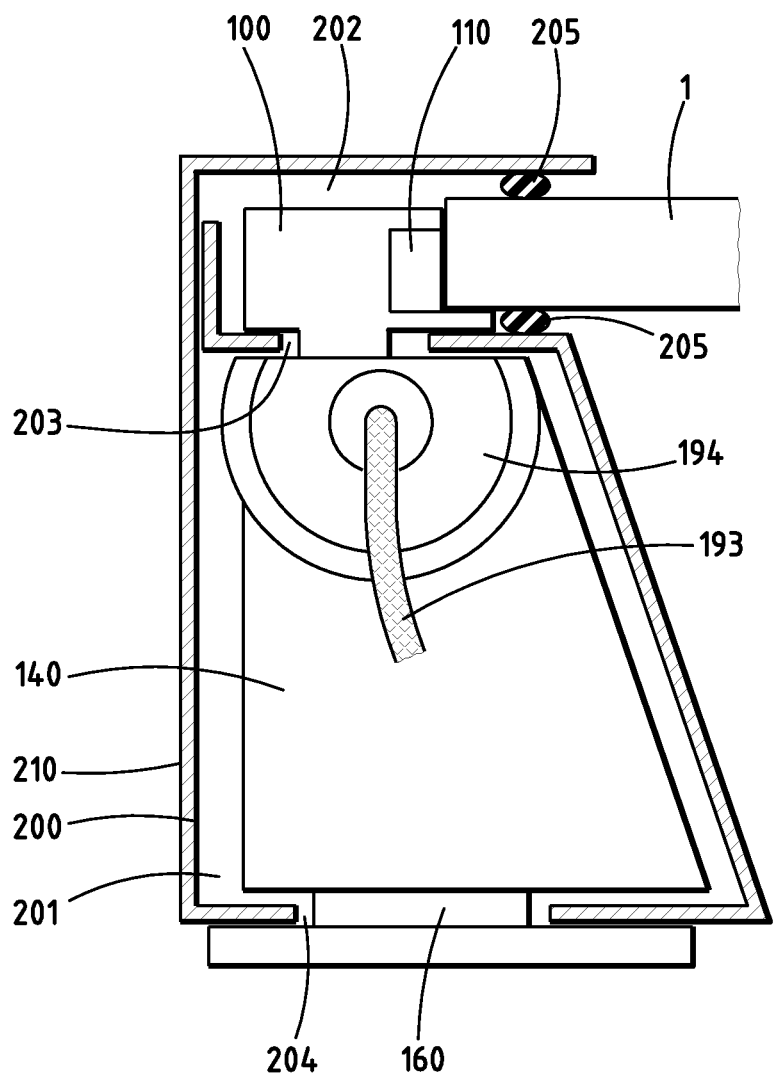
FIG. 8 is a sectional view of an external connection device of a photovoltaic panel which is inserted in a frame for supporting a photovoltaic panel.

As illustrated in FIG. 8, a connection device for a photovoltaic panel is inserted in the upright 210 of a frame 200 which receives the edge of the photovoltaic panel 1 in a groove 202.

The connection device comprises, in accordance with what has been described above, a male connector 100, an interconnection bar 160, external connectors and a means for retaining the male connector 100, the interconnection bar 160 and the external connectors (in the Figure only the sleeve 194 and a single external connector can be seen).

The means for retaining and assembling is a hollow retention sleeve 140 which is arranged at the inner side 201 of the tubular portion of the upright 210 of the frame 200 facing, on the one hand, an opening 203 which is provided in the upper portion of the tubular portion of the upright 201 and a cover 204 which is provided in the lower portion of the tubular portion of the upright 201.

The male connector 100 which is mounted on the edge of the photovoltaic panel 1 by means of a spacer 110 is introduced inside the hollow portion 201 of the upright 210 and moves through the upper opening 203 and is thereby inserted inside the hollow retention sleeve 140.

In the same manner, the interconnection bar 160 is introduced inside the hollow portion 201 of the upright 210 and moves through the lower opening 204 and is thereby inserted inside the hollow retention sleeve 140.

With that arrangement, it is possible to change the bypass diodes, for example, in order to repair the device without any risk of inadvertently touching the electrically active portions of the photovoltaic modules.

Finally, the sleeves of the electrical conductors for connection to the external connection lugs are received in the hollow portion (only the sleeve 194 and the conductor 193 are visible in FIG. 8).

Figure 9:
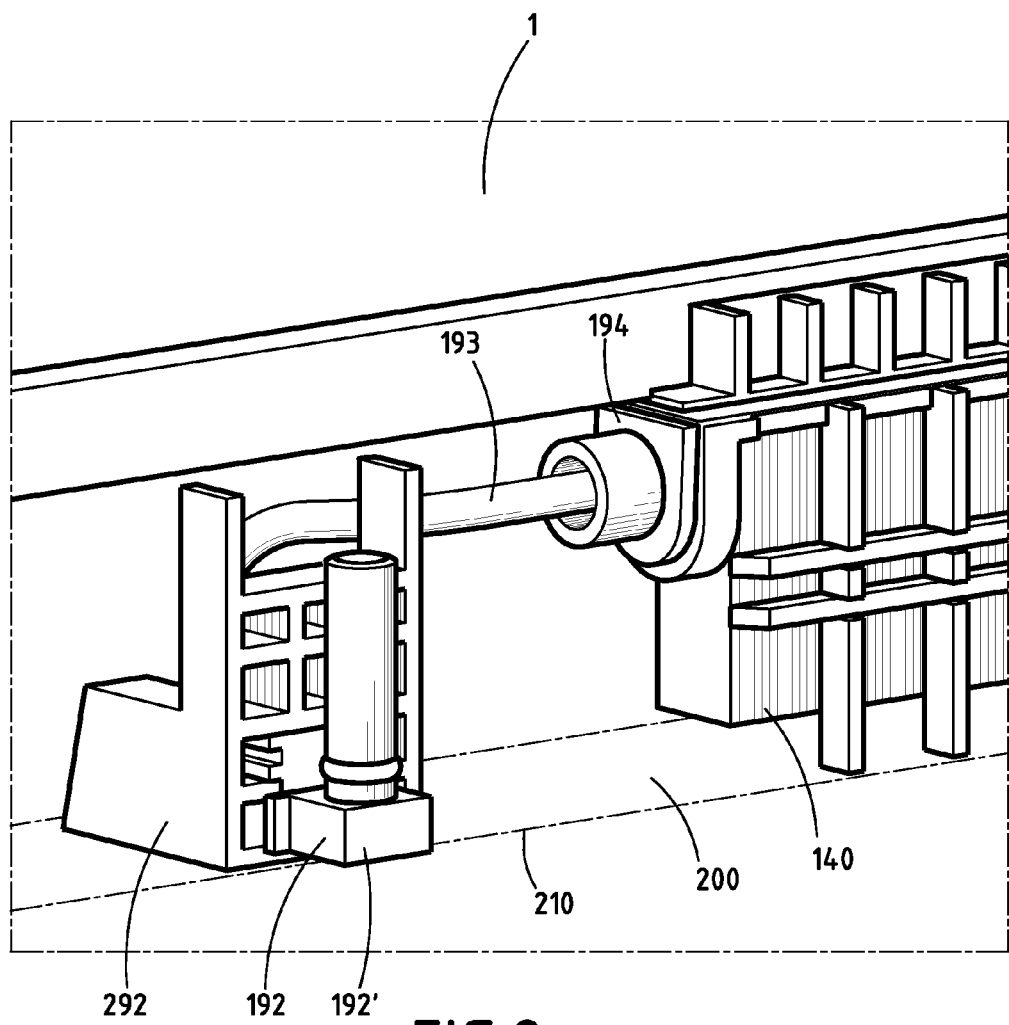
FIG. 9 is a perspective view, with cutaway portions, of a male external connector which is inserted in a frame for supporting a photovoltaic panel.

As can be seen in FIG. 9, an external connector of the male type comprises a conductor 193 which extends out of the hollow retention sleeve 140 through the flexible sleeve 194 which connects an electrically operating paddle (not visible in FIG. 9) which is arranged inside the hollow retention sleeve 140 and a male external connection lug 192.

The external connection lug which extends outside the upright 210 of the frame 200 comprises a base 192' which extends through an opening provided in the side wall of the upright 210 and which cooperates with a retention spacer 292 which is provided inside the upright 201. In the case illustrated, the male lug is orientated upwards.

Figure 10:
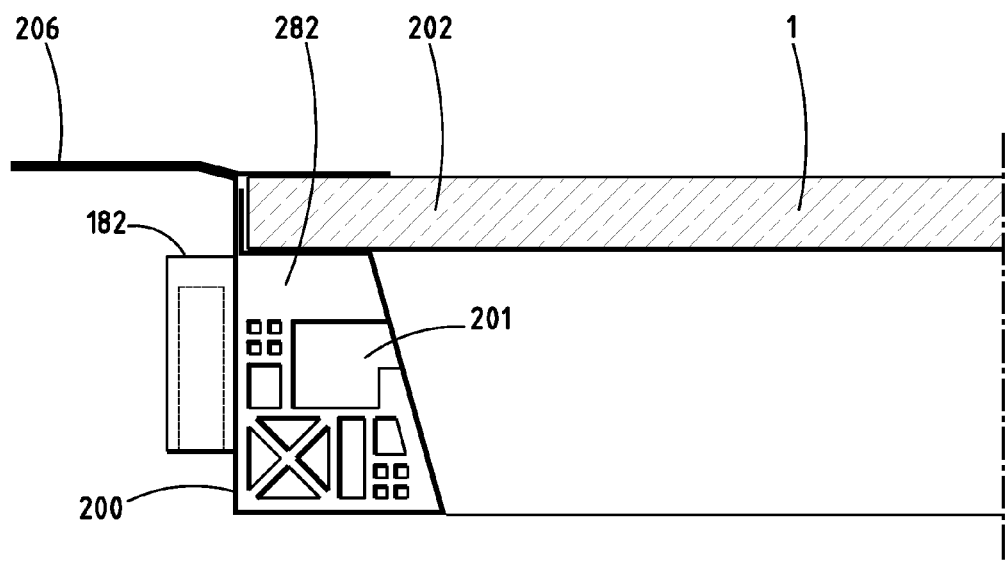
FIG. 10 is a side view of a female external connector which is inserted in a frame for supporting a photovoltaic panel.

As illustrated in FIG. 10, a female lug 182 extends outside the upright in order to cooperate with a retention spacer 282 and with an electrical conductor (not visible in the Figure).

That female lug is orientated downwards so as to be able to cooperate with a male lug of an adjacent frame and thereby to allow the interconnection of adjacent panels.

It will be appreciated that, at the side of that lug orientated downwards, the upright of the frame comprises, in its upper portion, a wing 206 which extends outwards and which ensures the tightness at the junction between two adjacent panels.

In the second embodiment described, the male lug is orientated upwards and the female lug is orientated downwards, but the reverse arrangement is possible.

Figure 11:
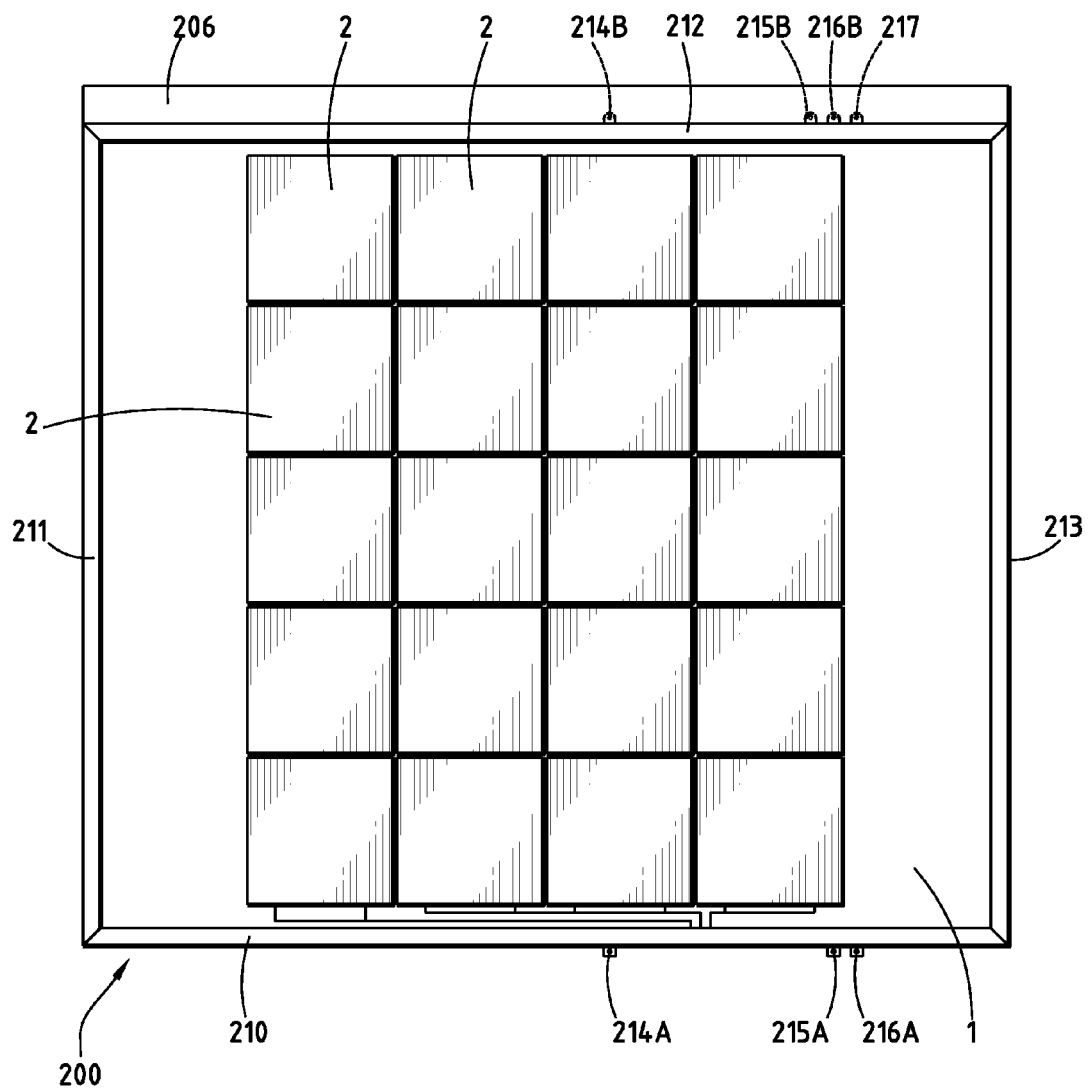
FIG. 11 is a top view of a photovoltaic panel which is arranged in a support frame comprising connectors.

As can be seen in FIG. 11, the frame 200 which supports the panel 1 of photovoltaic cells 2 comprises male external connectors 214A, 215A, 216A which are located on a first upright 210 which contains the external electrical connection device (not visible in the Figure) of the photovoltaic cells and female external connectors 2148, 215B, 216B and 217, which are located on a second upright 212 of the frame, located opposite the first upright 210. The male connectors 214A, 215A and 216A and the female connectors 214B, 215B and 216C are provided so as to face each other in pairs.

In that manner, when two frames are arranged one above the other, the male connectors of one can cooperate with the female connectors of the other.

Furthermore, the male and female connectors are connected either to the external connection device or to each other, in accordance with their intended use, by means of electrical conductors which are received in the hollow portions of the frame 200. In that manner, the electrical conductors are both protected and concealed.

The number of external connectors and the electrical connections to each other can be adapted in accordance with the individual requirements for each application and the person skilled in the art knows how to determine suitable connections.

In particular, it is possible to provide assemblies in series or assemblies in parallel for the panels.

It is further possible to provide connections for the return circuits. Those connections will comprise, for each frame, a male external connector and a female external connector, which are directly connected by an electrical conductor arranged inside the uprights of the frame.

The construction of the frame by metal strips being bent in accordance with horizontal bending lines has the advantage of readily allowing the connectors and, more generally, the electric circuits to be inserted. The connectors, the supporting spacers and the electrical conductors for interconnection between connectors can be positioned on the pre-cut metal strips which are intended to construct the uprights of the frame when they are only partially bent. When the different pieces which constitute the connection device are in place, it is possible to finish bending the metal strips and the assembly of the frame. In that manner, the connection means except for the lugs which must extend outside the uprights are completely contained inside the uprights. In that manner, those connection means are both concealed and protected.

By way of example, there have been partially illustrated different phases of production of a frame containing connectors.

Figure 12:
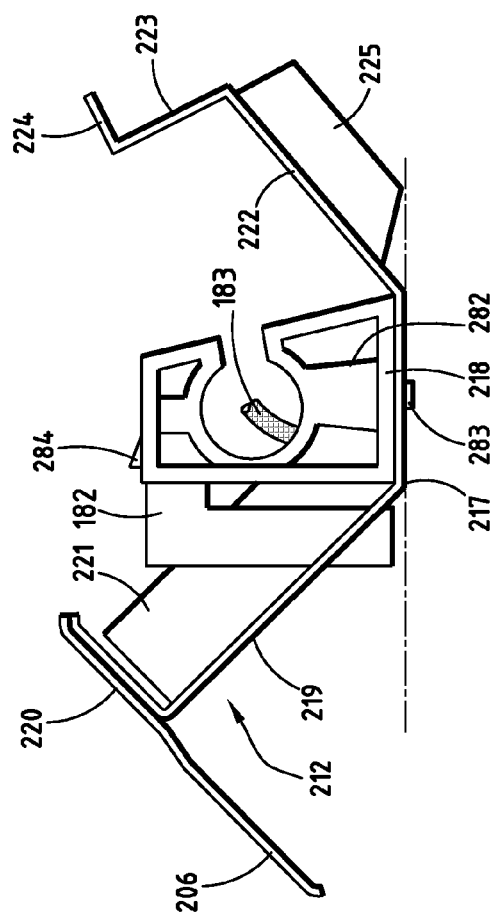
FIG. 12 is a sectional view of an upright of the frame comprising an external connection lug in a first assembly phase.

FIG. 12 illustrates in section an upright 210 which receives a female external connector 182 in a first production phase.

The upright 210 is constituted by a metal strip which has been bent partially so as to confer on it a given rigidity whilst constituting an open structure.

That upright comprises a base 217 which is perforated with a hole 218 which is intended to receive a pin 283 for fixing the spacer 282 which supports the female lug 182 of the female external connector.

The upright 212 also comprises a lateral external face 219 and a lateral internal face 222.

The lateral external face 219 carries an external wing 206, an internal wing 220 and a junction member 221. The external wing 206 is intended to ensure the tightness at the junction between two adjacent frames. The internal wing 220 is intended to cover the edge of the photovoltaic panel which is retained in the frame.

The member 221 serves to ensure the junction between two adjacent uprights.

The lateral internal face 222 is extended by a wing 223 which comprises an edge 224, which are intended to form the upper wall of the tubular portion of the upright and thereby to constitute the lower face of the groove intended to receive the edge of the photovoltaic panel. The edge 224 is suitable for being able to be welded to the lateral external face 219 at the end of assembly of the upright. The lateral internal face 222 is further extended by at least one junction member 225 which serves to ensure the junction with an adjacent upright.

As illustrated in FIG. 12, the upright is open which allows the internal provision of a spacer 282 which carries a female external connection lug 182.

The spacer 282 which is of plastics material comprises, in its lower portion, a fixing pin 283 which is inserted in the hole 218 of the lower face 217 of the upright. At its upper portion, the spacer 282 comprises a stud 284 which allows retention of the lateral internal face 222 by clip-fitting the wing 223.

The lateral external face 219 comprises an opening which is not visible in the Figure and which allows passage of the external connection lug.

With that arrangement, it is easy to form a female external connection lug on the metal strip which is intended to constitute an upright then to enclose that connection lug outside the upright by finishing the bending of the lateral faces of the upright, as will be described below.

The description which has been given above relates to positioning a female external connection lug. However, the person skilled in the art will understand that the positioning of the male external connection lugs, positioning of the sleeve for retaining the assembly of the male connector and the interconnection bar of the external connection device, as well as spacers for retaining the electrical connection conductors, are carried out in the same manner, that is to say, on partially bent metal strips, in order to constitute open structures.

Figure 13:
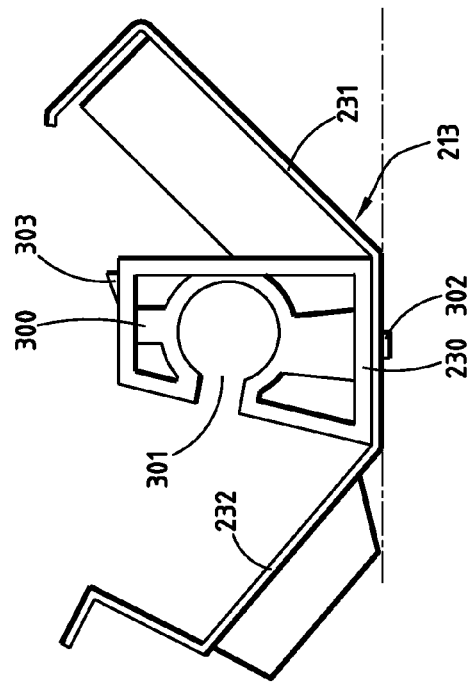
FIG. 13 is a sectional view of an upright of the frame comprising a spacer in the first assembly phase.

By way of example, FIG. 13 illustrates a spacer 300 which is formed, for example, in the upright 213 provided between the uprights 210 and 212 which carry the connection devices.

The spacer 300 which is only intended to retain the electrical connection conductors comprises a central opening 301, which is intended to receive the electrical conductors, a fixing pin 302 on its lower face and a clip-fit stud 303 for the wings of the upright 213 on its upper face.

The upright 211 comprises a base 230 which is surrounded by a lateral external face 231 and a lateral internal face 232. The upright differs from the one which has been described above only in that it does not comprise any external wing which is intended to ensure the tightness at the junction between two adjacent frames, nor any opening for allowing the external connection lug to pass.

When the connection means and the spacers for retaining the electrical connection conductors are arranged on the metal strips which are intended to constitute the uprights of the frame, those strips are arranged side by side in an arrangement corresponding to the non-bent frame, and the electrical junction conductors are positioned in order to constitute the internal electrical circuits of the frame.

Once the internal circuits are constituted, the bending of the lateral internal faces of the uprights is finished so as to surround the connection devices or the spacers which are provided on the metal strips which are intended to constitute the uprights and, in that manner, to clip-fit the lateral internal faces to the clip-fit studs. By way of example, FIG. 14 illustrates the upright 212, on which there is arranged a female external connection lug 182 which is carried by the spacer 282. That Figure shows that the lateral internal face 222 of the upright is completely bent and that it surrounds the spacer 282 on which it is retained by clip-fitting by means of the stud 284. However, the lateral external face 219 is still in the open position.

The four uprights are then bent in order to constitute a rectangular frame which is assembled by welding the fixing members and the fixing member 225 which are provided on the lateral internal faces of the adjacent uprights.

There is thereby obtained a frame 200A, as illustrated in FIG. 15, of which the lateral external faces of the uprights are in an open position, moved away outwards. FIG. 15 shows the lateral faces 220A and 222A of the uprights 210A and 212A in an open position. FIG. 15 also shows female external connection lugs 182A and male external connection lugs 192A. The person skilled in the art will understand that all the connection means which the frame must comprise are in place and that all the lateral external faces are in an open position moved away outwards.

When the frame is in the arrangement which has been described above, it is possible to provide a photovoltaic panel 1A on the uprights of the frame 200A, as can be seen in FIG. 16 (this Figure shows only three uprights 210A, 211A, 212A, but it will be appreciated that the photovoltaic panel also rests on the fourth upright which is not visible in the Figure).

Once the photovoltaic panel is arranged on the upright of the frame, it is possible to continue the assembly by bending the lateral external faces, in particular the lateral external faces 220A, 222A which are visible in the Figure, towards the inner side of the frame, as is illustrated in FIG. 17, and by finishing by welding in particular the members for fixing the lateral external faces of the uprights to the adjacent uprights, and the four upper and lower corners of the uprights 210, 211, 212, 213.

The photovoltaic panel is thus mounted on a frame which incorporates the connection means in the tubular uprights thereof.

The invention claimed is:

1. A device for the external electrical connection of the electrically active cells of an electrically active panel, such as the electricity-generating cells of a photovoltaic panel, wherein said device comprises:
- a male connector which is arranged on the edge of the photovoltaic panel and which comprises a plurality of external connection strips which are electrically connected to the electricity-generating cells,
- a bar for electrically interconnecting the external connection strips, comprising electrical junction means intended to be electrically connected to the external connection strips, said electrical junction means being connected to each other by electrical circuits which are suitable for the interconnection of the electricity-generating cells,
- a first external connector which comprises an electrical junction means with respect to an external connection strip which is connected to a first polarity of the electricity-generating cells,
- a second external connector which comprises an electrical junction means with respect to an external connection strip which is connected to a second polarity of electricity-generating cells and
- a means for retaining and assembling the male connector, the interconnection bar, the first external connector and the second external connector.

2. The device according to claim 1, wherein the male connector comprises a support bar for supporting the external connection strips, said support bar comprising a plate which extends at the outer side of the photovoltaic panel, and in that the external connection strips are wound around the plate.

3. The device according to claim 2, wherein the male connector further comprises a spacer which comprises recesses which are intended to receive the external connection strips, and in that the support bar comprises a head which is suitable for being fitted to the spacer.

4. The device according to claim 3, wherein the spacer is adhesively bonded to the edge of the photovoltaic panel.

5. The device according to claim 2, wherein the plate extends at the outer side of the photovoltaic panel, perpendicularly relative to the surface of the photovoltaic panel.

6. The device according to claim 2, wherein the means for retaining and assembling is a hollow retention sleeve which comprises an upper opening, in which the support bar for supporting the external connection strips is fitted, and in that the periphery of the upper opening and the portion of the support bar that is intended to be fitted in the upper opening are formed so as to ensure the tightness of the junction of the hollow retention sleeve and the support bar.

7. The device according to claim 6, wherein the support bar comprises a peripheral bead which is intended to ensure the tightness of the junction with respect to the hollow retention sleeve.

8. The device according to claim 6, wherein the hollow retention sleeve and the support bar are adhesively bonded to each other.

9. The device according to claim 6, wherein the hollow retention sleeve comprises, at each of the ends thereof, a passage for one of the first and second external connectors.

10. The device according to claim 9, wherein each passage for the first or second external connector is an indentation whose periphery comprises a groove.

11. The device according to claim 9, wherein each of the first and second external connectors comprises an electrical junction paddle with respect to an external connection strip which is electrically connected to an external connection lug and a sleeve which is composed of flexible polymer material and which is suitable for being fitted in the passage for an external connector of the hollow retention sleeve so as to constitute tight closure of the passage.

12. The device according to claim 11, wherein the external connection lug of an external connector is a male lug and the external connection lug of the other external connector is a female lug.

13. The device according to claim 11, wherein the junction paddle of at least one of the first and second external connectors is brazed to an external connection strip.

14. The device according to claim 11, wherein the junction paddle of at least one of the first and second external connectors is connected by compression of lamellar contacts on an external connection strip.

15. The device according to claim 6, wherein the electrical interconnection bar comprises a plate which comprises electrical junction runners with respect to the external connection strips and which can be reversibly fitted in a lower opening of the hollow retention sleeve.

16. The device according to claim 15, wherein the periphery of the lower opening of the hollow retention sleeve and the portion of the interconnection bar which is intended to be fitted in the hollow retention sleeve are formed so as to ensure the tightness of the junction of the hollow retention sleeve and the interconnection bar.

17. The device according to claim 1, wherein the male connector, the interconnection bar and the means for retaining and assembling comprise at least one piece of plastics material.

18. The device according to claim 1, wherein the electrical circuits which are suitable for interconnecting the electricity-generating cells comprise bypass diodes and parallel or series connections of electricity-generating cells.

19. The device according to claim 1, wherein the external connection strips are conductive strips which are partially insulated by insulation layers such as enamel layers.

20. Electrically active panel such as a photovoltaic panel which is mounted in a support frame which comprises four tubular hollow uprights and a device for the external electrical connection of the electrically active cells of external connection means for the electrically active panel, wherein the device for the external electrical connection of the electrically active cells is in accordance with claim 1 and is provided inside the tubular hollow uprights of the support frame.

21. The electrically active panel which is mounted in the support frame according to claim 20, wherein the device for the external electrical connection of the electrically active cells comprises at least one male external connection lug and one female external connection lug which extend outside the support frame and which are provided in such a manner that the electrically active panels of two adjacent support frames can be connected to each other by a male lug of a frame and a female lug of the other support frame being fitted together.

22. The electrically active panel which is mounted in the support frame according to claim 20, wherein the support frame is constituted by at least one metal strip which is cut and shaped by bending.

23. The electrically active panel which is mounted in the support frame according to claim 20, wherein the support frame is constituted by four separate uprights which are assembled together.

* * * * *